(12) United States Patent
Seo et al.

(10) Patent No.: US 11,588,141 B2
(45) Date of Patent: Feb. 21, 2023

(54) DISPLAY APPARATUS AND METHOD OF MANUFACTURING THE SAME

(71) Applicant: Samsung Display Co., Ltd., Yongin-si (KR)

(72) Inventors: Dongkyun Seo, Yongin-si (KR); Hyoungsik Kim, Yongin-si (KR); Heekyun Shin, Yongin-si (KR); Junho Sim, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 154 days.

(21) Appl. No.: 17/110,138

(22) Filed: Dec. 2, 2020

(65) Prior Publication Data

US 2021/0226181 A1   Jul. 22, 2021

(30) Foreign Application Priority Data

Jan. 20, 2020  (KR) .................. 10-2020-0007391

(51) Int. Cl.
 *H01L 51/56* (2006.01)
 *H01L 51/00* (2006.01)
 *H01L 27/32* (2006.01)

(52) U.S. Cl.
 CPC .......... *H01L 51/56* (2013.01); *H01L 51/0097* (2013.01); *H01L 27/3244* (2013.01); *H01L 2227/323* (2013.01); *H01L 2227/326* (2013.01); *H01L 2251/5338* (2013.01)

(58) Field of Classification Search
 None
 See application file for complete search history.

(56) References Cited

U.S. PATENT DOCUMENTS

| 7,189,631 B2 | 3/2007 | Yamazaki et al. |
| 9,184,180 B2 | 11/2015 | Huh et al. |
| 9,748,521 B2 | 8/2017 | Kachatryan et al. |
| 2015/0060870 A1* | 3/2015 | Ro ................. B32B 38/0008 156/273.1 |
| 2019/0123068 A1 | 4/2019 | Lee et al. |
| 2019/0157587 A1* | 5/2019 | Jia ................. G02F 1/133305 |
| 2020/0194719 A1* | 6/2020 | Choi ............... H01L 51/0097 |

FOREIGN PATENT DOCUMENTS

| KR | 10-1079757 B1 | 10/2011 |
| KR | 10-2015-0009289 A | 1/2015 |
| KR | 10-2016-0046074 A | 4/2016 |
| KR | 10-2019-0045953 A | 5/2019 |

* cited by examiner

*Primary Examiner* — J. E. Schoenholtz
(74) *Attorney, Agent, or Firm* — Lewis Roca Rothgerber Christie LLP

(57) ABSTRACT

In a method of manufacturing a display apparatus, the method includes: preparing a support substrate; forming a metal oxide layer on a surface of the support substrate, the metal oxide layer comprising first charges; forming a debonding layer on a surface of the metal oxide layer, the debonding layer comprising second charges opposite to the first charges; forming a flexible substrate on a surface of the debonding layer; forming a display element and a thin film encapsulation layer on a surface of the flexible substrate, the display element comprising a thin film transistor and an organic light-emitting diode; and isolating the flexible substrate from the support substrate.

20 Claims, 8 Drawing Sheets

|   |   | THICKNESS (Å) | | | |
|---|---|---|---|---|---|
|   |   | 60 | 120 | 600 | 1200 |
| A | ΔT (%) | 4.1 | 2.0 | 1.4 | 0.4 |
| A | ADHESIVE FORCE(gf/in) | 5.9 | 11 | - | - |
| B | ΔT (%) | 4.7 | 3.2 | 1.7 | 0.8 |
| B | ADHESIVE FORCE(gf/in) | 5.4 | 10 | - | - |

DISPLAY APPARATUS AND METHOD OF MANUFACTURING THE SAME

CROSS-REFERENCE TO RELATED APPLICATION

The present application claims priority to and the benefit of Korean Patent Application No. 10-2020-0007391, filed on Jan. 20, 2020, in the Korean Intellectual Property Office, the disclosure of which is incorporated herein in its entirety by reference.

BACKGROUND

1. Field

Aspects of some example embodiments of the present disclosure relate to a display apparatus and a method of manufacturing the display apparatus.

2. Description of Related Art

Recently, research into flexible display apparatuses that may be curved has been actively conducted. A flexible display apparatus may be used in a folded or curved state, and may be utilized in various applications. A flexible display apparatus includes a display device such as an organic light-emitting diode on a flexible substrate.

Because of the flexible characteristics of a flexible substrate used in a flexible display apparatus, it may be relatively difficult to handle the flexible substrate during manufacturing processes. Therefore, a flexible substrate may be placed on a support substrate having a sufficient rigidity during a plurality of manufacturing process operations, and then the flexible substrate may be isolated from the support substrate.

The above information disclosed in this Background section is only for enhancement of understanding of the background and therefore the information discussed in this Background section does not necessarily constitute prior art.

SUMMARY

Aspects of some example embodiments of the present disclosure relate to a display apparatus and a method of manufacturing the display apparatus, and for example, to a display apparatus having an improved quality and a method of manufacturing the display apparatus.

In a display apparatus and a method of manufacturing the display apparatus of a related system and method, when a flexible substrate is isolated from a support substrate, for example, by using laser, the flexible substrate may be damaged due to the laser. Thus, an operation of separating a flexible substrate from a support substrate may result in damage to the flexible substrate that causes the quality of the display apparatus to degrade.

One or more example embodiments according to the present disclosure include a display apparatus, in which damage to a flexible substrate is prevented or reduces to improve quality, and a method of manufacturing the display apparatus. However, the above technical features and characteristics are merely examples, and the scope of embodiments according to the present disclosure is not limited thereto.

Additional aspects will be set forth in part in the description which follows and, in part, will be apparent from the description, or may be learned by practice of the presented example embodiments of the disclosure.

According to one or more example embodiments, in a method of manufacturing a display apparatus, the method includes preparing a support substrate, forming a metal oxide layer on a surface of the support substrate, the metal oxide layer including first charges, forming a debonding layer on a surface of the metal oxide layer, the debonding layer including second charges opposite to the first charges, forming a flexible substrate on a surface of the debonding layer, forming a display element and a thin film encapsulation layer on a surface of the flexible substrate, the display element including a thin film transistor and an organic light-emitting diode, and isolating the flexible substrate from the support substrate.

According to some example embodiments, in the isolating of the flexible substrate from the support substrate, the flexible substrate may be isolated from the support substrate based on the debonding layer.

According to some example embodiments, in the isolating of the flexible substrate from the support substrate, the debonding layer may be at least partially remained on an opposite surface of the flexible substrate.

According to some example embodiments, the support substrate may include the second charges.

According to some example embodiments, the preparing of the support substrate may include irradiating plasma onto the support substrate.

According to some example embodiments, the metal oxide layer may include at least one metal oxide material selected from the group consisting of silicon oxide ($SiO_2$), manganese oxide ($MnO_2$), zirconium oxide ($ZrO_2$), aluminum oxide ($Al_2O_3$), titanium oxide ($TiO_2$), indium tin oxide (ITO), chromium oxide ($CrO_3$), iron oxide ($Fe_3O_4$), lead oxide (PbO), nickel oxide (NiO), cadmium oxide (CdO), or magnesium oxide (MgO).

According to some example embodiments, in the forming of the metal oxide layer, the metal oxide layer may be formed on the support substrate to a thickness of about 80 Å to about 120 Å.

According to some example embodiments, the debonding layer may include graphene oxide According to some example embodiments, in the forming of the debonding layer, the debonding layer may be formed on the metal oxide layer to a thickness of about 30 Å to about 50 Å.

According to some example embodiments, in the forming of the debonding layer, the debonding layer may have an adhesive force of about 2 gf/in to about 5 gf/in.

According to some example embodiments, in the forming of the debonding layer, the debonding layer may be formed by any one of methods including spray coating, spin coating, screen coating, offset printing, inkjet printing, pad printing, knife coating, kiss coating, gravure coating, brushing, ultrasonic micronized spray coating, and spray-mist spray coating.

According to some example embodiments, the first charges may include positive charges and the second charges include negative charges.

According to one or more example embodiments, a display apparatus includes a flexible substrate including a display area and a non-display area around the display area, a thin film transistor on a surface of the flexible substrate, an organic light-emitting diode on the thin film transistor, and a debonding layer on an opposite surface of the flexible substrate, the debonding layer including negative charges.

According to some example embodiments, the debonding layer may include graphene oxide.

According to some example embodiments, the debonding layer may be on the opposite surface of the flexible substrate to a thickness of about 10 Å to about 30 Å.

According to some example embodiments, the debonding layer may have an adhesive force of about 2 gf/in to about 5 gf/in.

According to some example embodiments, the organic light-emitting diode may include a pixel electrode, an intermediate layer on the pixel electrode, the intermediate layer including an emission layer, and an opposite electrode on the intermediate layer.

According to some example embodiments, the display apparatus may further include a storage capacitor including a lower electrode on the surface of the flexible substrate, and an upper electrode overlapping the lower electrode.

According to some example embodiments, the display apparatus may further include a thin film encapsulation layer on the organic light-emitting diode, the thin film encapsulation layer including at least one inorganic encapsulation layer and at least one organic light-emitting diode.

According to some example embodiments, the flexible substrate may include at least one material selected from the group consisting of polyethersulfone, polyacrylate, polyether imide, polyethylene naphthalate, polyethylene terephthalate, polyphenylene sulfide, polyarylate, polyimide, polycarbonate, or cellulose acetate propionate.

Other aspects, features and characteristics of embodiments according to the present disclosure will become better understood through the accompanying drawings, the claims and the detailed description.

BRIEF DESCRIPTION OF THE DRAWINGS

The above and other aspects, features, and characteristics of certain example embodiments of the disclosure will be more apparent from the following description taken in conjunction with the accompanying drawings, in which.

DETAILED DESCRIPTION

Figure 1:
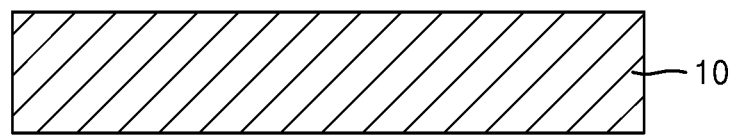
FIGS. 1 to 6 are cross-sectional views for describing manufacturing processes of a display apparatus according to some example embodiments.

Reference will now be made in more detail to aspects of some example embodiments, which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects of embodiments according to the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As embodiments according to the present disclosure allow for various changes and numerous embodiments, example embodiments will be illustrated in the drawings and described in detail in the written description. The attached drawings for illustrating one or more embodiments are referred to in order to gain a sufficient understanding of characteristics of embodiments according to the present disclosure. However, the example embodiments may have different forms and should not be construed as being limited to the descriptions set forth herein.

While such terms as "first," "second," etc., may be used to describe various components, such components are not be limited to the above terms. The above terms are used only to distinguish one component from another.

An expression used in the singular encompasses the expression of the plural, unless it has a clearly different meaning in the context.

In the present specification, it is to be understood that the terms "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a layer, region, or component is referred to as being "formed on" another layer, region, or component, it may be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

In the specification, the phrase "A and/or B" denotes A, B, or A and B. In addition, the phrase "at least one of A and B" denotes A, B, or A and B.

In the specification herein, a line "extending in a first direction or a second direction" denotes extending in the first direction or the second direction in zig-zags or in a curve, as well as extending straightly in the first direction or the second direction.

Throughout the specification, the phrase "in a plan view" denotes viewing a target portion from the top, and the phrase "in a cross-sectional view" denotes viewing of a cross-section of the target portion that is vertically cut from a lateral direction. Throughout the specification, the expression "overlap" includes overlapping "in a plan view" and overlapping "in a cross-sectional view".

The example embodiments will be described below in more detail with reference to the accompanying drawings. Those components that are the same or are in correspondence are rendered the same reference numeral regardless of the figure number.

FIGS. 1 to 6 are cross-sectional views for describing manufacturing processes of a display apparatus according to some example embodiments.

Hereinafter, various operations in a method of manufacturing a display apparatus according to some example embodiments will be described sequentially with reference to FIGS. 1 to 6. Although various operations in a method of manufacturing a display apparatus are described and illustrated in the figures, some example embodiments may include additional operations or fewer operations without departing from the spirit and scope of embodiments according to the present disclosure.

Referring to FIG. 1 to FIG. 6, the method of manufacturing a display apparatus according to some example embodiments includes preparing a support substrate 10, forming a metal oxide layer 20 including first charges on a surface 10a (e.g., a first surface) of the support substrate 10, forming a debonding layer 30 including second charges opposite to the first charges on a surface 20a of the metal oxide layer 20 (e.g., a first surface 20a of the metal oxide layer 20 that is facing away from the support substrate 10), forming a flexible substrate 100 on a surface 30a of the debonding layer 30 (e.g., a first surface 30a that is facing away from the metal oxide layer 20), forming a display element 200 including a thin film transistor and an organic light-emitting diode and a thin film encapsulation layer 300 on a surface 100a of the flexible substrate 100 (e.g., a first surface 100a that is facing away from the flexible substrate 100), and isolating the flexible substrate 100 and the support substrate 10 from each other. Here, the first charges may include positive charges and the second charges may include negative charges.

Referring to FIG. 1, a process of preparing the support substrate 10 may be performed. According to some example embodiments, the support substrate 10 may include various materials, for example, a glass material, a metal material, or any other suitable material (or materials) having a sufficient rigidity. For example, the support substrate 10 may include a glass material. Because the flexible substrate 100 has a flexible characteristic, the support substrate 10 may support the flexible substrate 100 while the display elements including the thin film transistor and the organic light-emitting diode are arranged on the flexible substrate 100.

When the support substrate 10 includes the glass material, the support substrate 10 may include the second charges. For example, when the support substrate 10 includes the glass material, the support substrate 10 may include negative charges.

According to some example embodiments, during the process of preparing the support substrate 10, plasma may be irradiated onto the support substrate 10. When the plasma is irradiated onto the support substrate 10, a surface of the support substrate 10 may be charged with negative charges, and the support substrate 10 may include more negative charges.

Because the support substrate 10 and the debonding layer 30 that will be described later include the negative charges, when the debonding layer 30 including the negative charges is coated on the support substrate 10 including the negative charges, the debonding layer 30 may not be easily coated on the support substrate 10.

To address this, a layer including positive charges may be provided between the support substrate 10 including the negative charges and the debonding layer 30 including the negative charges in order to make the support substrate 10 easily coated with the debonding layer 30.

Figure 2:
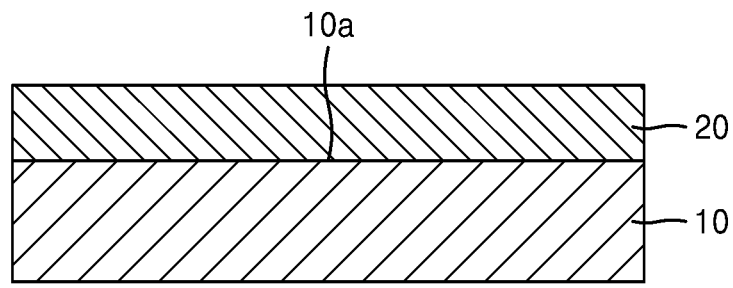

Referring to FIG. 2, after the preparing of the support substrate 10, a process of forming the metal oxide layer 20 including the first charges on the surface 10a of the support substrate 10 may be performed. The metal oxide layer 20 may include positive charges, that is, the first charges. The metal oxide layer 20 may include a material having a positive zeta potential under the coating condition of the debonding layer 30 that will be described later. Here, the coating condition of the debonding layer 30 may include pH of about 5.5 to about 7. Debye length denotes a length that may affect ions/particles having opposite charges. As the Debye length increases, the coating characteristics of the material in the debonding layer 30 that will be described in more detail later may be improved. Because the Debye length is proportional with a permittivity ($\varepsilon$), the metal oxide layer 20 according to some example embodiments may include a material having a positive zeta potential under the coating conditions of the debonding layer 30 that will be described in more detail later and having a high permittivity ($\varepsilon$).

The metal oxide layer 20 may include at least one metal oxide material selected from the group consisting of silicon oxide ($SiO_2$), manganese oxide ($MnO_2$), zirconium oxide ($ZrO_2$), aluminum oxide ($Al_2O_3$), titanium oxide ($TiO_2$), indium tin oxide (ITO), chromium oxide ($CrO_3$), iron oxide ($Fe_3O_4$), lead oxide (PbO), nickel oxide (NiO), cadmium oxide (CdO), and magnesium oxide (MgO). For example, the metal oxide layer 20 may include aluminum oxide ($Al_2O_3$) or titanium oxide ($TiO_2$) that has a positive zeta potential under the coating condition of the debonding layer 30 and has a relatively large permittivity ($\varepsilon$). However, the metal oxide layer 20 of embodiments according to the present disclosure is not limited to the above-stated materials.

The metal oxide layer 20 may be formed on the surface 10a of the support substrate 10 by a sputtering method, a Physical Vapor Deposition (PVD) method, a Chemical Vapor Deposition (CVD) method, etc.

Figure 3:
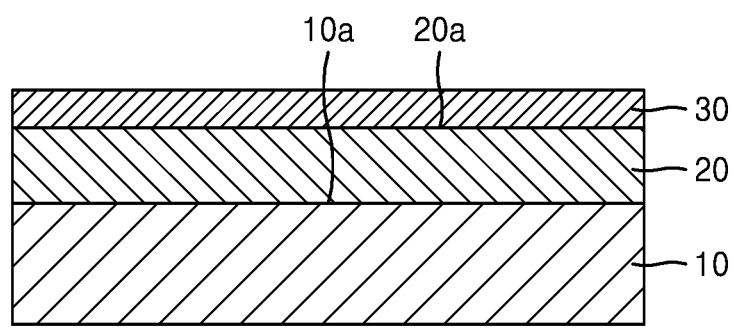

Referring to FIG. 3, after the forming of the metal oxide layer 20 including the first charges on the surface 10a of the support substrate 10, a process of forming the debonding layer 30 including the second charges opposite to the first charges on a surface 20a of the metal oxide layer 20 may be further performed. That is, after forming the metal oxide layer 20 including positive charges on the surface 10a of the support substrate 10 having the negative charges, the debonding layer 30 having the negative charges may be on the surface 20a of the metal oxide layer 20 having the positive charges.

The debonding layer 30 according to the embodiment may include graphene oxide. The debonding layer 30 including the graphene oxide may be formed on the surface 20a of the metal oxide layer 20 by any of a variety of methods including spray coating, dip coating, spin coating, screen coating, offset printing, inkjet printing, pad printing, knife coating, kiss coating, gravure coating, brushing, ultrasonic micronized spray coating, and spray-mist spray coating. For example, the debonding layer 30 may be formed on the surface 20a of the metal oxide layer 20 by spraying a solution, in which graphene oxide having negative charges is dispersed, through a nozzle spray.

Figure 7:
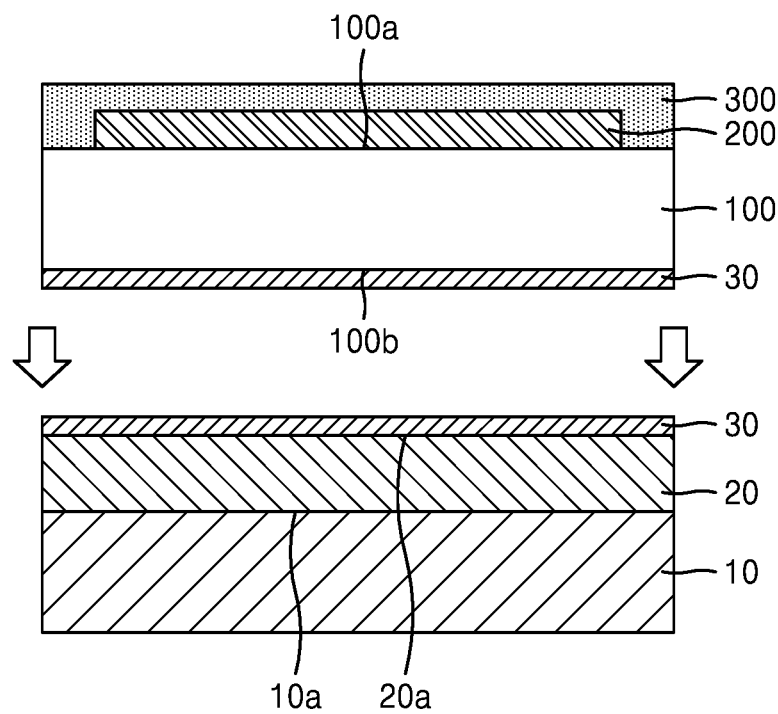
FIG. 7 is a table showing an adhesive force of a debonding layer according to a thickness of a metal oxide layer in a display apparatus according to some example embodiments.

FIG. 7 is a table showing an adhesive force of the debonding layer 30 according to a thickness of the metal oxide layer 20 in a display apparatus according to some example embodiments. For example, FIG. 7 is a table showing, in the display apparatus according to some example embodiments, a coated thickness of the debonding layer 30 including the graphene oxide and an adhesive force of the debonding layer 30 including the graphene oxide, according to a thickness of the metal oxide layer 20 including aluminum oxide (A) and a thickness of the metal oxide layer 20 including titanium oxide (B).

Because the graphene oxide is generally opaque and a transmittance is reduced as the debonding layer 30 including the graphene oxide is coated, the coated thickness of the debonding layer 30 including the graphene oxide may be identified via a transmittance variation amount (ΔT (%)). Also, the adhesive force of the debonding layer 30 was measured when the flexible substrate and the support substrate are isolated from each other after forming a barrier layer on the flexible substrate including polyimide (PI). In general, when the debonding layer 30 has a large adhesive force, the flexible substrate and the support substrate may not be easily isolated from each other.

As shown in FIG. 7, as to the coated thickness of the debonding layer 30 including the graphene oxide according to the thickness of the metal oxide layer 20 including aluminum oxide (A) and the metal oxide layer 20 including titanium oxide (B), because the transmittance variation amount (ΔT (%)) is reduced as the thickness of the metal oxide layer 20 increases, it may be identified that the debonding layer 30 is less coated on the surface 20a of the metal oxide layer 20 as the thickness of the metal oxide layer 20 increases.

It may be identified that the adhesive force of the debonding layer 30 including the graphene oxide is reduced as the transmission variation amount (ΔT (%)) is increased.

Therefore, as the thickness of the metal oxide layer 20 including the aluminum oxide (A) and the metal oxide layer 20 including the titanium oxide (B) is reduced, the thickness of the debonding layer 30 including the graphene oxide formed on the metal oxide layer 20 may be increased, and the adhesive force of the debonding layer 30 including the graphene oxide may be reduced.

Therefore, the metal oxide layer 20 according to some example embodiments may be formed on the surface 10a of the support substrate 10 to a thickness of about 10 Å to about 200 Å, about 20 Å to about 180 Å, about 50 Å to about 150 Å, etc. For example, the metal oxide layer 20 may be formed on the surface 10a of the support substrate 10 to a thickness of about 80 Å to about 120 Å.

Also, the debonding layer 30 according to some example embodiments may be formed on the surface 20a of the metal oxide layer 20 to a thickness of about 20 Å to about Å, about 30 Å to about 60 Å, about 20 Å to about 50 Å, etc. For example, the debonding layer 30 may be formed on the surface 20a of the metal oxide layer 20 to a thickness of about 30 Å to about 50 Å.

The debonding layer 30 according to some example embodiments may have an adhesive force of about 2 gram-force/inch (gf/in) to about 6 gf/in, about 2 gf/in to about 5 gf/in, about 1 gf/in to about 5 gf/in, etc. in order for the flexible substrate 100 that will be described in more detail later to be easily isolated from the support substrate 10. For example, the adhesive layer 30 may have an adhesive force of about 2 gf/in to about 3 gf/in.

Figures 4, 5:
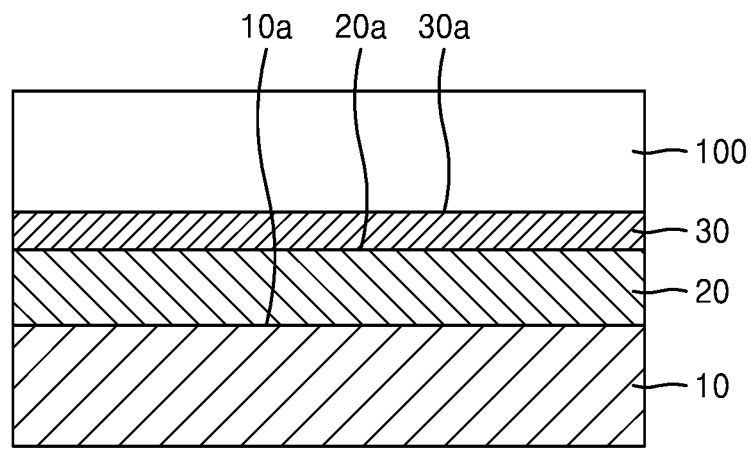

Referring to FIG. 4, after the forming of the debonding layer 30 including the second charges opposite to the first charges on the surface 20a of the metal oxide layer 20, a process of forming the flexible substrate 100 on the surface 30a of the debonding layer 30.

The flexible substrate 100 according to some example embodiments may include at least one material selected from the group consisting of polyethersulfone, polyacrylate, polyetherimide, polyethylene naphthalate, polyethylene terephthalate, polyphenylene sulfide, polyarylate, polyimide, polycarbonate, or cellulose acetate propionate. For example, the flexible substrate 100 may include polyimide.

In the process of forming the flexible substrate 100 on the surface 30a of the debonding layer 30, polyimide is applied onto the surface 30a of the debonding layer 30 and the polyimide is cured, and then, the flexible substrate 100 including the polyimide may be formed on the surface 30a of the debonding layer 30.

Referring to FIG. 5, after the forming of the flexible substrate 100 on the surface 30a of the debonding layer 30, a process of forming a display element 200 including a thin film transistor TFT (see FIG. 12) and an organic light-emitting diode OLED (see FIG. 12) and a thin film encapsulation layer 300 on a surface 100a of the flexible substrate 100 may be further performed.

The display element 200 formed on the surface 100a of the flexible substrate 100 may include the thin film transistor TFT (see FIG. 12) and the organic light-emitting diode OLED (see FIG. 12) that will be described in more detail later. The thin film transistor TFT (see FIG. 12) may include a semiconductor layer 134 (see FIG. 12), a gate electrode 136 (see FIG. 12), and a connecting electrode, and the organic light-emitting diode OLED (see FIG. 12) may include a pixel electrode 210 (see FIG. 12), an intermediate layer 220 (see FIG. 12), and an opposite electrode 230 (see FIG. 12).

The thin film encapsulation layer 300 covers the display element 200 including the thin film transistor TFT (see FIG. 12) and the organic light-emitting diode OLED (see FIG. 12), and may be formed on the surface 100a of the flexible substrate 100. The thin film encapsulation layer 300 may include at least one inorganic encapsulation layer and at least one organic encapsulation layer.

The thin film transistor TFT (see FIG. 12), the organic light-emitting diode OLED (see FIG. 12), and the thin film encapsulation layer 300 will be described in more detail later with reference to FIG. 12.

Figure 6:
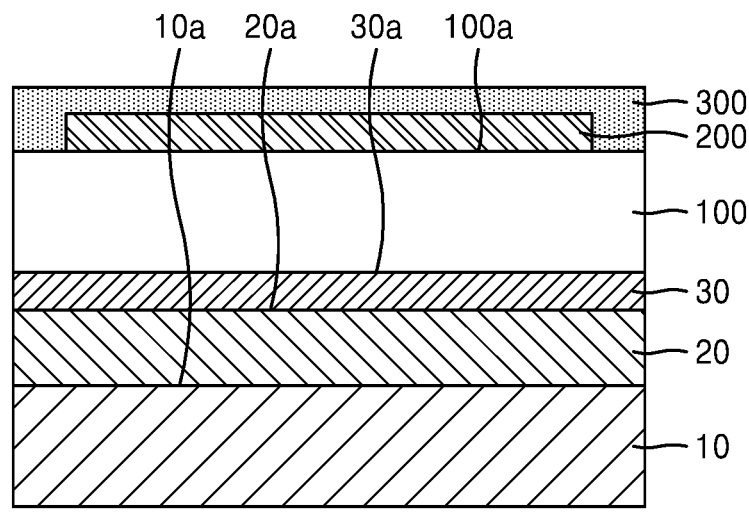

Referring to FIG. 6, after the forming of the display element 200 including the thin film transistor TFT (see FIG. 12) and the organic light-emitting diode OLED (see FIG. 12) and the thin film encapsulation layer 300 on the surface 100a of the flexible substrate 100, a process of isolating the flexible substrate 100 from the support substrate 10 may be further performed.

In the process of isolating the flexible substrate 100 from the support substrate 10 according to the embodiment, the flexible substrate 100 and the support substrate 10 may be isolated from each other based on the debonding layer 30. For example, the flexible substrate 100 and the support substrate 10 may be isolated from each other, so that the debonding layer 30 may at least partially remain on an opposite surface 100b that is opposite to the surface 100a of the flexible substrate 100. Also, the debonding layer 30 may at least partially remain on the surface 20a of the metal oxide layer 20 that is on the surface 10a of the support substrate 10.

The debonding layer 30 at least a part of which remains on the opposite surface 100b of the flexible substrate 100 may have a thickness of about 5 Å to about 40 Å, about 10 Å to about 40 Å, about 5 Å to about 35 Å, etc. For example, the debonding layer 30 at least a part of which remains on the opposite surface 100b of the flexible substrate 100 may have a thickness of about 10 Å to about 30 Å.

The debonding layer 30 at least a part of which remains on the support substrate 10 may have a thickness of about 5 Å to about 40 Å, about 10 Å to about 40 Å, about 5 Å to about 35 Å, etc. For example, the debonding layer 30 at least a part of which remains on the support substrate 10 may have a thickness of about 10 Å to about 30 Å. For example, at least a part of the debonding layer 30 remaining on the opposite surface 100b of the flexible substrate 100 and at least a part of the debonding layer 30 remaining on the support substrate 10 may have the same thickness, at least a part of the debonding layer 30 remaining on the opposite surface 100b of the flexible substrate 100 may have a thickness greater than that of the at least a part of the debonding layer 30 remaining on the support substrate 10, or at least a part of the debonding layer 30 remaining on the opposite surface 100b of the flexible substrate 100 may have a thickness less than that of the at least a part of the debonding layer 30 remaining on the support substrate 10.

Figure 8:
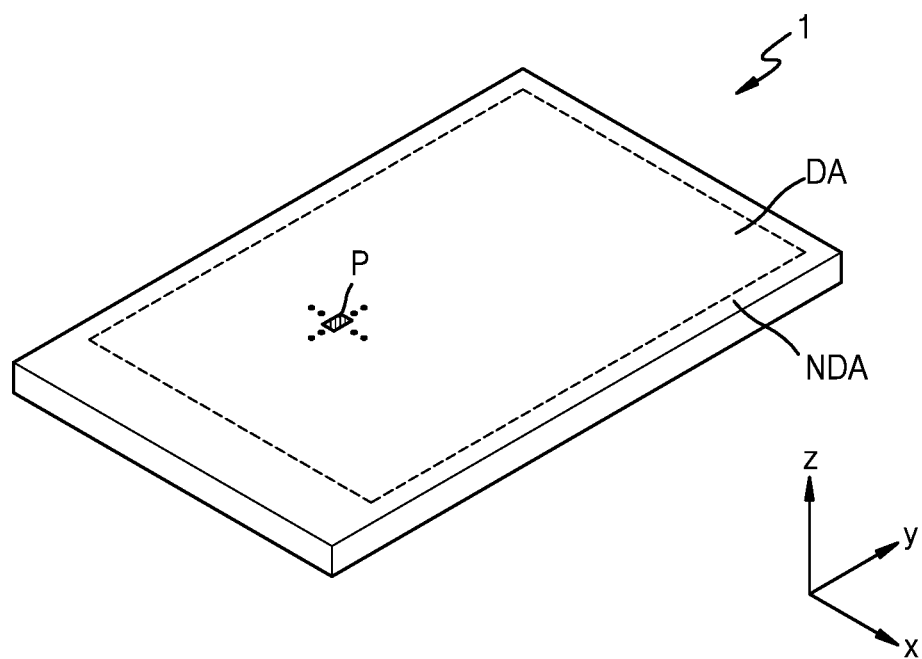
FIG. 8 is a perspective view of a display apparatus according to some example embodiments.

FIG. 8 is a perspective view of the display apparatus 1 according to some example embodiments.

Referring to FIG. 8, the display apparatus 1 may include a display area DA and a non-display area NDA on a periphery of the display area DA. The non-display area NDA may surround the display area DA. The display apparatus 1 may provide images by using light emitted from a plurality of pixels P in the display area DA. The non-display area NDA may not display images.

Hereinafter, according to some example embodiments, although the display apparatus 1 is described as being an organic light-emitting display apparatus, the disclosure is not limited thereto. In another embodiment, the display apparatus 1 may include an inorganic light-emitting display (or an inorganic EL display apparatus), or a quantum dot light-emitting display apparatus. For example, a light-emitting layer of a display element included in the display apparatus 1 may include an organic material, an inorganic material, quantum dots, an organic material and quantum dots, or an inorganic material and quantum dots.

FIG. 8 shows the display apparatus 1 having a flat display surface, but one or more embodiments are not limited thereto. According to some example embodiments, the display apparatus 1 may include a three-dimensional display surface or a curved display surface.

When the display apparatus 1 includes the three-dimensional display surface, the display apparatus 1 includes a plurality of display areas directing differently from one another, for example, a polyprism-type display surface. According to some example embodiments, when the display apparatus 1 includes a curved display surface, the display apparatus 1 may be implemented in various types, for example, a flexible display apparatus, a foldable display apparatus, a rollable display apparatus, etc.

FIG. 8 shows the display apparatus 1 that may be applied to a mobile terminal. According to some example embodiments, a mobile terminal may be configured by arranging electronic modules, a camera module, a power module, etc. mounted on a main board in a bracket/case together with the display apparatus 1. The display apparatus 1 according to some example embodiments may be applied to a large-sized electronic apparatus such as a television, a monitor, etc., and a small-medium size electronic apparatus such as a tablet terminal, a car navigation system, a game console, a smart watch, etc.

In FIG. 8, the display area DA of the display apparatus 1 has a rectangular shape, but the display area DA may have a circular shape, an elliptical shape, or a polygonal shape such as a triangular shape, a pentagonal shape, etc.

Figure 9:
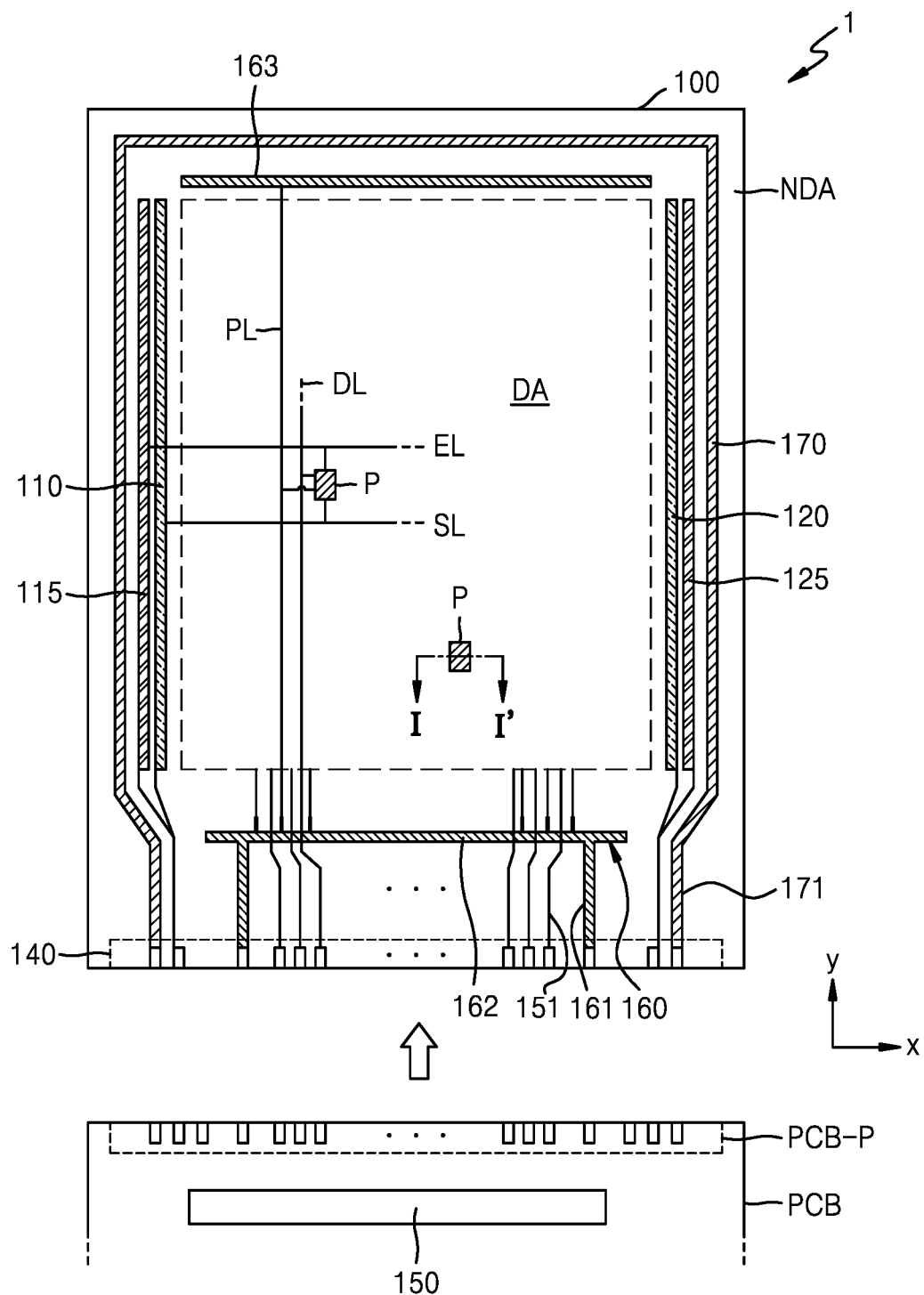
FIG. 9 is a plan view of a display apparatus according to some example embodiments.

FIG. 9 is a plan view of the display apparatus 1 according to some example embodiments.

Referring to FIG. 9, the display apparatus 1 includes a plurality of pixels P in the display area DA. Each of the plurality of pixels P may include an organic light-emitting diode OLED. Each of the plurality of pixels P may emit, for example, red light, green light, blue light, or white light through the organic light-emitting diode OLED. In the specification, the pixel P may emit red light, green light, blue light, or white light, as described above.

Each of the pixels P may be electrically connected to external pixels arranged in the non-display area NDA. The non-display area NDA may include a first scan driving circuit 110, a first emission driving circuit 115, a second scan driving circuit 120, a second emission driving circuit 125, a terminal 140, a data driving circuit 150, a first power supply line 160, and a second power supply line 170.

The first scan driving circuit 110 may provide each pixel P with a scan signal via a scan line SL. The first emission driving circuit 115 may provide each of the pixels P with an emission control signal via an emission control line EL. The second scan driving circuit 120 may be arranged in parallel with the first scan driving circuit 110 with the display area DA therebetween. Some of the pixels P arranged in the display area DA may be electrically connected to the first scan driving circuit 110, and the other pixels P may be electrically connected to the second scan driving circuit 120. In an embodiment, a second emission driving circuit 25 may be in parallel with the first emission driving circuit 115 with the display area DA therebetween. Some of the pixels P arranged in the display area DA may be electrically connected to the first emission driving circuit 115, and the other pixels P may be electrically connected to the second emission driving circuit 125.

The first emission driving circuit 115 is apart from the first scan driving circuit 110 in an X-direction on the non-display area NDA. According to some example embodiments, the first emission driving circuit 115 and the first scan driving circuit 110 may be alternately arranged in a Y-direction.

The terminal 140 may be arranged at a side of the flexible substrate 100. The terminal 140 may not be covered by an insulating layer, but is exposed and may be electrically connected to a printed circuit board PCB. A terminal PCB-P of the printed circuit board PCB may be electrically connected to the terminal 140 of the display apparatus 1. The printed circuit board PCB may transfer a signal or a power from a controller to the display apparatus 1. A control signal generated by the controller may be respectively transferred to the first and second scan driving circuits 110 and 120, the first and second emission driving circuits 115 and 125 via the printed circuit board PCB. The controller may provide the first power supply line 160 and the second power supply line 170 with a first power voltage ELVDD and a second power voltage ELVSS respectively through a first connecting line 161 and a second connecting line 171. The first power voltage ELVDD is supplied to each pixel P via a driving voltage line PL connected to the first power supply line 160, and the second power voltage ELVSS may be provided to an opposite electrode of each pixel P connected to the second power supply line 170.

The data driving circuit 150 is electrically connected to a data line DL. A data signal of the data driving circuit 150 may be provided to each of the pixels P via a connecting line 151 connected to the terminal 140 and the data line DL connected to the connecting line 151.

Although FIG. 9 shows that the data driving circuit 150 is on the printed circuit board PCB, the data driving circuit 150 may be on the flexible substrate 100 in another embodiment. For example, the data driving circuit 150 may be between the terminal 140 and the first power supply line 160.

The first power supply line 160 may include a first sub-line 162 and a second sub-line 163 that extend in parallel with each other in an X-direction with the display area DA therebetween. The second power supply line 170 has a loop shape having an open side and may partially surround the display area DA.

Figure 10:
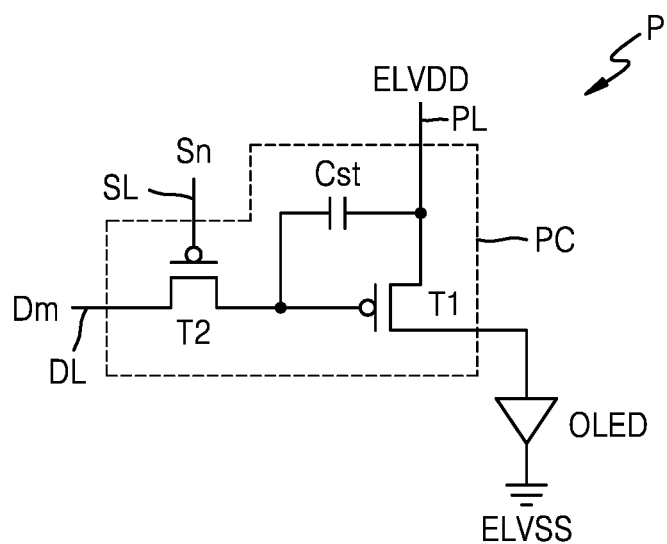
FIGS. 10 and 11 are equivalent circuit diagrams of a pixel included in a display apparatus according to some example embodiments.
Figure 11:
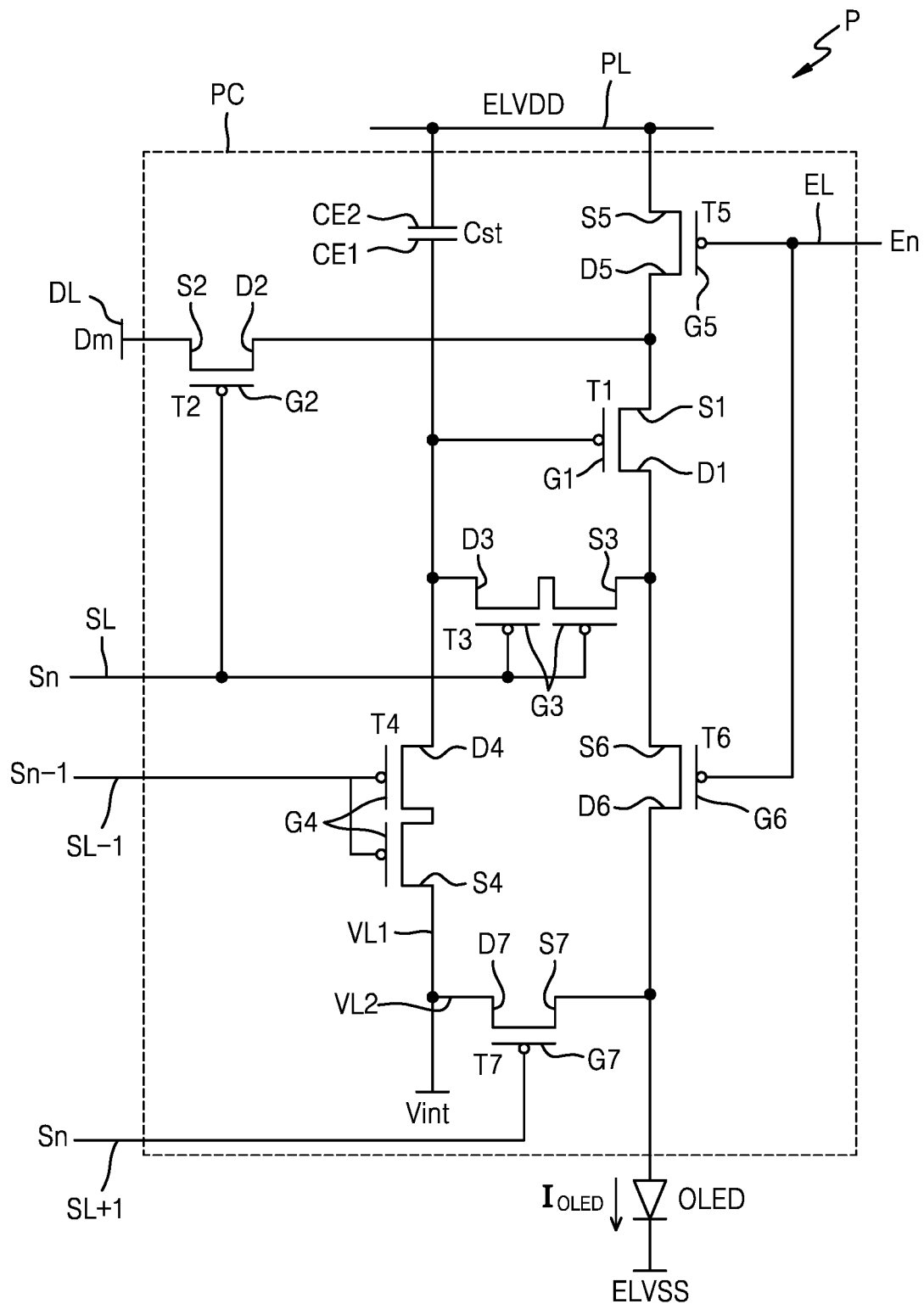

FIGS. 10 and 11 are equivalent circuit diagrams of the pixel P included in the display apparatus according to some example embodiments.

Referring to FIG. 10, each pixel P includes a pixel circuit PC connected to a scan line SL and a data line DL, and the organic light-emitting diode OLED connected to the pixel circuit PC.

The pixel circuit PC includes a driving thin film transistor T1, a switching thin film transistor T2, and a storage capacitor Cst. The switching thin film transistor T2 is connected to the scan line SL and the data line DL and transfers a data signal Dm input through the data line DL to the driving thin film transistor T1 according to a scan signal Sn input through the scan line SL.

The storage capacitor Cst is connected to the switching thin film transistor T2 and a driving voltage line PL and stores a voltage corresponding to a difference between a voltage transferred from the switching thin film transistor T2 and the first power voltage ELVDD (or driving voltage) supplied to the driving voltage line PL.

The driving thin film transistor T1 is connected to the driving voltage line PL and the storage capacitor Cst and may control a driving current flowing from the driving voltage line PL to the organic light-emitting diode OLED in response to the voltage value stored in the storage capacitor Cst. The organic light-emitting diode OLED may emit light having a certain luminance according to the driving current.

FIG. 10 shows an example in which the pixel circuit PC includes two thin film transistors and one storage capacitor, but example embodiments according to the present disclosure are not limited thereto. As shown in FIG. 11, the pixel circuit PC may include seven thin film transistors and one storage capacitor.

Referring to FIG. 11, the pixel P includes the pixel circuit PC and the organic light-emitting diode OLED electrically connected to the pixel circuit PC. The pixel circuit PC may include a plurality of thin film transistors T1 to T7, and the storage capacitor Cst. The plurality of thin film transistors T1 to T7 and the storage capacitor Cst may be connected to signal lines SL, SL−1, SL+1, EL, and DL, a first initialization voltage line VL1, a second initialization voltage line VL2, and the driving voltage line PL.

The signal lines SL, SL−1, SL+1, EL, and DL may include a scan line SL configured to transfer a scan signal Sn, a previous scan line SL−1 configured to transfer a previous scan signal Sn−1 to the first initialization thin film transistor T4, a post scan line SL+1 configured to transfer the scan signal Sn to the second initialization thin film transistor T7, the emission control line EL configured to transfer an emission control signal En to the operation control thin film transistor T5 and the emission control thin film transistor T6, and the data line DL intersecting with the scan line SL and configured to transfer a data signal Dm. The driving voltage line PL may be configured to transfer the driving voltage ELVDD to the driving thin film transistor T1, a first initialization voltage line VL1 may be configured to transfer an initialization voltage Vint to the first initialization thin film transistor T4, and a second initialization voltage line VL2 may be configured to transfer the initialization voltage Vint to the second initialization thin film transistor T7.

A driving gate electrode G1 of the driving thin film transistor T1 is connected to a lower electrode CE1 of the storage capacitor Cst, a driving source electrode S1 of the driving thin film transistor T1 is connected to the driving voltage line PL via the operation control thin film transistor T5, and a driving drain electrode D1 of the driving thin film transistor T1 is electrically connected to a pixel electrode of the organic light-emitting diode OLED via the emission control thin film transistor T6. The driving thin film transistor T1 receives the data signal Dm according to a switching operation of the switching thin film transistor T2 to supply a driving current IDLED to the organic light-emitting diode OLED.

A switching gate electrode G2 of the switching thin film transistor T2 is connected to the scan line SL, a switching source electrode S2 of the switching thin film transistor T2 is connected to the data line DL, a switching drain electrode D2 of the switching thin film transistor T2 is connected to the driving source electrode S1 of the driving thin film transistor T1 and at the same time, is connected to the driving voltage line PL at the lower side via the operation control thin film transistor T5. The switching thin film transistor T2 is turned on according to the scan signal Sn received through the scan line SL and performs a switching operation for transferring the data signal Dm transferred through the data line DL to the driving source electrode S1 of the driving thin film transistor T1.

A compensation gate electrode G3 of the compensation thin film transistor T3 is connected to the scan line SL, a compensation source electrode S3 of the compensation thin film transistor T3 is connected to the driving drain electrode D1 of the driving thin film transistor T1 and at the same time, is connected to the pixel electrode of the organic light-emitting diode OLED via the emission control thin film transistor T6, and a compensation drain electrode D3 of the compensation thin film transistor T3 is connected to the lower electrode CE1 of the storage capacitor Cst, a first initialization drain electrode D4 of the first initialization thin film transistor T4, and the driving gate electrode G1 of the driving thin film transistor T1. The compensation thin film transistor T3 is turned on according to the scan signal Sn received through the scan line SL to electrically connect the driving gate electrode G1 and the driving drain electrode D1 of the driving thin film transistor T1 to each other and to diode-connect the driving thin film transistor T1.

A first initialization gate electrode G4 of the first initialization thin film transistor T4 is connected to the previous scan line SL−1, a first initialization source electrode S4 of the first initialization thin film transistor T4 is connected to the first initialization voltage line VL1, and a first initialization drain electrode D4 of the first initialization thin film transistor T4 is connected to the lower electrode CE1 of the storage capacitor Cst, the compensation drain electrode D3 of the compensation thin film transistor T3, and the driving gate electrode G1 of the driving thin film transistor T1. The first initialization thin film transistor T4 is turned on according to the previous scan signal Sn−1 transferred through the previous scan line SL−1 to transfer the initialization voltage Vint to the driving gate electrode G1 of the driving thin film transistor T1 and perform an initialization operation for initializing a voltage at the driving gate electrode G1 of the driving thin film transistor T1.

An operation control gate electrode G5 of the operation control thin film transistor T5 is connected to the emission control line EL, an operation control source electrode S5 of the operation control thin film transistor T5 is connected to the driving voltage line PL at the lower side, and an operation control drain electrode D5 of the operation control thin film transistor T5 is connected to the driving source electrode S1 of the driving thin film transistor T1 and the switching drain electrode D2 of the switching thin film transistor T2.

An emission control gate electrode G6 of the emission control thin film transistor T6 is connected to the emission control line EL, an emission control source electrode S6 of the emission control thin film transistor T6 is connected to the driving drain electrode D1 of the driving thin film transistor T1 and the compensation source electrode S3 of the compensation thin film transistor T3, and an emission control drain electrode D6 of the emission control thin film transistor T6 is electrically connected to a second initialization source electrode S7 of the second initialization thin film transistor T7 and the pixel electrode of the organic light-emitting diode OLED.

The operation control thin film transistor T5 and the emission control thin film transistor T6 are simultaneously (e.g., concurrently) turned on according to an emission control signal En transferred through the emission control line EL to transfer a driving voltage ELVDD to the organic light-emitting diode OLED and to allow a driving current IDLED to flow in the organic light-emitting diode OLED.

The second initialization gate electrode G7 of the second initialization thin film transistor T7 is connected to the post scan line SL+1, a second initialization source electrode S7 of the second initialization thin film transistor T7 is connected to the emission control drain electrode D6 and the pixel electrode of the organic light-emitting diode OLED, and a second initialization drain electrode D7 of the second initialization thin film transistor T7 is connected to the second initialization voltage line VL2.

In addition, the scan line SL and the post scan line SL+1 are electrically connected to each other, and a same scan signal Sn may be applied to the scan line SL and the post scan line SL+1. Therefore, the second initialization thin film transistor T7 is turned on according to the scan signal Sn transferred through the post scan line SL+1 and performs an operation of initializing the pixel electrode of the organic light-emitting diode OLED.

An upper electrode CE2 of the storage capacitor Cst is connected to the driving voltage line PL, and a common electrode of the organic light-emitting diode OLED is connected to the second power voltage ELVSS. Accordingly, the organic light-emitting diode OLED emits light by receiving the driving current IDLED from the driving thin film transistor T1 to display images.

In FIG. 11, the compensation thin film transistor T3 and the first initialization thin film transistor T4 have dual-gate electrodes, but the compensation thin film transistor T3 and the first initialization thin film transistor T4 may each have one gate electrode.

Figure 12:
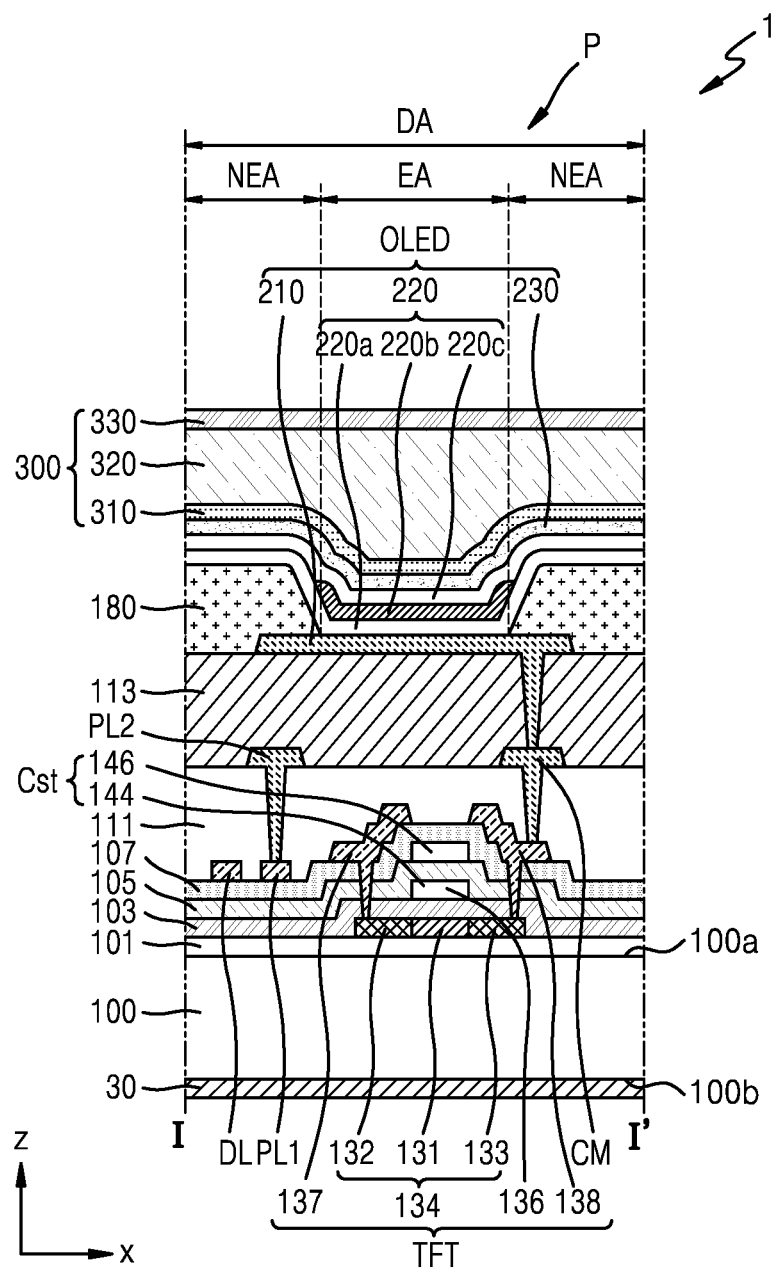
FIG. 12 is a cross-sectional view of a display apparatus according to some example embodiments.

FIG. 12 is a cross-sectional view of the display apparatus 1 according to an embodiment. For example, FIG. 12 shows a cross-sectional view of the display apparatus 1 taken along the line I-I of FIG. 9.

FIG. 12 shows the display apparatus 1 including the flexible substrate 100 isolated from the support substrate 10 according to some example embodiments.

Referring to FIG. 12, the flexible substrate 100 may include a polymer resin. When the flexible substrate 100 includes the polymer resin, the display apparatus 1 may be flexible, rollable, or bendable.

The flexible substrate 100 according to some example embodiments may include at least one material selected from the group consisting of polyethersulfone, polyacrylate, polyetherimide, polyethylene naphthalate, polyethylene terephthalate, polyphenylene sulfide, polyarylate, polyimide, polycarbonate, or cellulose acetate propionate. For example, the flexible substrate 100 may include polyimide.

According to some example embodiments, a barrier layer may be on one surface 100a of the flexible substrate 100. For example, the flexible substrate 100 may include a first substrate including polyimide, a first barrier layer, a second substrate including polyimide, and a second barrier layer that are sequentially stacked.

A buffer layer 101 may be on the surface 100a of the flexible substrate 100. The buffer layer 101 is on the surface 100a of the flexible substrate 100 to reduce or prevent infiltration of impurities, moisture, or external air from below the flexible substrate 100, and may provide a flat surface on the flexible substrate 100. The buffer layer 101 may include an inorganic material such as an oxide material or a nitride material, an organic material, or an inorganic-organic composite material, and may have a single-layered or multi-layered structure including the inorganic material and the organic material.

The debonding layer 30 may be at least partially on the opposite surface 100b that is opposite to the surface 100a of the flexible substrate 100. The debonding layer 30 may include graphene oxide, and may include negative charges. The debonding layer 30 may have an adhesive force of about 2 gf/in to about 6 gf/in, about 2 gf/in to about 5 gf/in, about 1 gf/in to about 5 gf/in, etc. For example, the debonding layer 30 may have an adhesive force of about 2 gf/in to about 3 gf/in.

The debonding layer 30 according to the embodiment may have a thickness of about 5 Å to about 40 Å, about 10 Å to about 40 Å, about 5 Å to about 35 Å, etc. For example, the debonding layer 30 may be on the opposite surface 100b of the flexible substrate 100 to a thickness of about 10 Å to about 30 Å.

The thin film transistor TFT and the organic light-emitting diode OLED electrically connected to the thin film transistor TFT may be on the surface 100a of the flexible substrate 100.

The thin film transistor TFT may be on the buffer layer 101. The thin film transistor TFT may include a semiconductor layer 134, a gate electrode 136 overlapping the semiconductor layer 134, and a connecting electrode electrically connected to the semiconductor layer 134. The thin film transistor TFT is connected to the organic light-emitting diode OLED to drive the organic light-emitting diode OLED.

The semiconductor layer 134 is on the buffer layer 101, and may include a channel region 131 overlapping the gate electrode 136, and a source region 132 and a drain region 133 at opposite sides of the channel region 131 and having impurities of higher concentration than that of the channel region 131. Here, the impurities may include N-type impurities or P-type impurities. The source region 132 and the drain region 133 may be electrically connected to the connecting electrode.

The semiconductor layer 134 may include oxide semiconductor and/or silicon semiconductor. When the semiconductor layer 134 includes oxide semiconductor, the semiconductor layer 134 may include an oxide material of at least one selected from the group consisting of, for example, indium (In), gallium (Ga), stannum (Sn), zirconium (Zr), vanadium (V), hafnium (Hf), cadmium (Cd), germanium (Ge), chrome (Cr), titanium (Ti), and zinc (Zn). For example, the active layer 134 may include ITZO (InSnZnO), IGZO (InGaZnO), etc. When the semiconductor layer 134 includes silicon semiconductor, the semiconductor layer 134 may include, for example, amorphous silicon (a-Si) or low temperature poly-silicon (LPTS) obtained by crystallizing a-Si.

A first insulating layer 103 may be on the semiconductor layer 134. The first insulating layer 103 may include at least one inorganic insulating material selected from the group consisting of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The first insulating layer 103 may have a single-layered or a multi-layered structure including the inorganic insulating material.

The gate electrode 136 may be on the first insulating layer 103. The gate electrode 136 may have a single or multi-layered structure including one or more metal selected from aluminum (Al), platinum (Pt), palladium (Pd), argentum (Ag), magnesium (Mg), aurum (Au), nickel (Ni), neodymium (Nd), iridium (Ir), chrome (Cr), lithium (Li), calcium (Ca), molybdenum (Mo), titanium (Ti), tungsten (W), and copper (Cu). The gate electrode 136 may be connected to a gate line that applies an electrical signal to the gate electrode 136. The semiconductor layer 134 and the gate electrode 136 may be insulated from each other via the first insulating layer 103.

A second insulating layer 105 may be on the gate electrode 136. The second insulating layer 105 may include at least one inorganic insulating material selected from the group consisting of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The second insulating layer 105 may have a single-layered or a multi-layered structure including the inorganic insulating material.

The storage capacitor Cst may be on the first insulating layer 103. The storage capacitor Cst may include a lower electrode 144 and an upper electrode 146 overlapping the lower electrode 144. The lower electrode 144 of the storage capacitor Cst overlaps the gate electrode 136 of the thin film transistor TFT, and the lower electrode 144 of the storage capacitor Cst may be integrally provided with the gate electrode 136 of the thin film transistor TFT. In an embodiment, the storage capacitor Cst may not overlap the thin-film transistor TFT and the lower electrode 144 of the storage capacitor Cst may be an independent element separate from the gate electrode 136 of the thin-film transistor TFT.

The upper electrode 146 of the storage capacitor Cst may include, for example, aluminum (Al), platinum (Pt), palladium (Pd), argentum (Ag), magnesium (Mg), aurum (Au), nickel (Ni), neodymium (Nd), iridium (Ir), chromium (Cr), lithium (Li), calcium (Ca), molybdenum (Mo), titanium (Ti), tungsten (W), and/or copper (Cu), and may have a single-layered or multi-layered structure including the above stated materials.

A third insulating layer 107 may be on the upper electrode 146. The third insulating layer 107 may include at least one inorganic insulating material selected from the group consisting of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The third insulating layer 107 may have a single-layered or a multi-layered structure including the inorganic insulating material.

The data line DL, a lower driving voltage line PL1, the source electrode 137, and the driving voltage line 138 that are the connecting electrodes may be on the third insulating layer 107.

The data line DL, the lower driving voltage line PL1, the source electrode 137 and the driving voltage line 138, e.g., the connecting electrodes, may each include a conductive material including molybdenum (Mo), aluminum (Al), copper (Cu), titanium (Ti), etc., and may have a single-layered or multi-layered structure including the above materials. The data line DL, the lower driving voltage line PL1, and the source and drain electrodes 137 and 138, that is, the connecting electrodes, may each have a multi-layered structure including Ti/Al/Ti. According to some example embodiments, the data line DL, the lower driving voltage line PL1, and the source and drain electrodes 137 and 138, that is, the connecting electrodes, may include the same material.

The data line DL, the lower driving voltage line PL1, the source electrode 137, and the drain electrode 138 may be covered by a first planarization layer 111. The first planarization layer 111 may include a single-layered or multi-layered structure including an organic material or an inorganic material. The first planarization layer 111 may include a general universal polymer such as benzocyclobutene (BCB), polyimide, hexamethyldisiloxane (HMDSO), polymethylmethacrylate (PMMA), or polystyrene (PS), polymer derivatives having phenol groups, acryl-based polymer, imide-based polymer, aryl ether-based polymer, amide-based polymer, fluoride-based polymer, p-xylene-based polymer, vinyl alcohol-based polymer, and blends thereof. In addition, the first planarization layer 111 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), etc. After arranging the first planarization layer 111, a chemical and mechanical polishing may be performed to provide a flat upper surface.

An upper driving voltage line PL2 and a contact metal layer CM may be on the first planarization layer 111. The upper driving voltage line PL2 and the contact metal layer CM may each include aluminum (Al), copper (Cu), titanium (Ti), etc. and may have a single-layered or multi-layered structure. The upper driving voltage line PL2 and the contact metal layer CM may each have a multi-layered structure including Ti/Al/Ti. In an embodiment, the upper driving voltage line PL2 and the contact metal layer CM may include the same material.

The contact metal layer CM may be electrically connected to the thin film transistor TFT via a contact hole penetrating through the first planarization layer 111, and the pixel electrode 210 may be electrically connected to the contact metal layer CM via a contact hole penetrating through a second planarization layer 113.

The second planarization layer 113 may be on the upper driving voltage line PL2 and the contact metal layer CM. The second planarization layer 113 may include a single-layered or multi-layered structure including an organic material or an inorganic material. The second planarization layer 113 may include a general universal polymer such as benzocyclobutene (BCB), polyimide, hexamethyldisiloxane (HMDSO), polymethylmethacrylate (PMMA), or polystyrene (PS), polymer derivatives having phenol groups, acryl-based polymer, imide-based polymer, aryl ether-based polymer, amide-based polymer, fluoride-based polymer, p-xylene-based polymer, vinyl alcohol-based polymer, and blends thereof. In addition, the second planarization layer 113 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), etc.

The organic light-emitting diode OLED including the pixel electrode 210, the intermediate layer 220, and the opposite electrode 230 may be on the second planarization layer 113. The pixel electrode 210 may be electrically connected to the contact metal layer CM via the contact hole penetrating through the second planarization layer 113, the contact metal layer CM may be electrically connected to the thin film transistor TFT via the contact hole penetrating through the first planarization layer 111, and thus, the organic light-emitting diode OLED may be electrically connected to the thin film transistor TFT.

The pixel electrode 210 may be on the second planarization layer 113. The pixel electrode 210 may include a (semi-)transmissive electrode or a reflective electrode. The pixel electrode 210 may include a reflective layer including aluminum (Al), platinum (Pt), palladium (Pd), argentum (Ag), magnesium (Mg), aurum (Au), nickel (Ni), neodymium (Nd), iridium (Ir), chromium (Cr), lithium (Li), calcium (Ca), molybdenum (Mo), titanium (Ti), tungsten (W), copper (Cu), and a compound thereof, and a transparent or semi-transparent electrode layer on the reflective layer. The transparent or semi-transparent electrode layer may include at least one electrode material selected from the group consisting of indium tin oxide (ITO), indium zinc oxide (IZO), zinc oxide (ZnO), indium oxide ($In_2O_3$), indium gallium oxide, and aluminum zinc oxide (AZO). The pixel electrode 210 may include a stack structure including ITO/Ag/ITO.

A pixel defining layer 180 may be on the second planarization layer 113, and the pixel defining layer 180 may include an opening at least partially exposing the pixel electrode 210. A region exposed by the opening of the pixel defining layer 180 may be defined as an emission area EA. A periphery of the emission areas EA is a non-emission area NEA, and the non-emission area NEA may surround the emission areas EA. That is, the display area DA includes a plurality of emission areas EA and the non-emission area NEA surrounding the plurality of emission areas EA. The pixel defining layer 180 increases a distance between the pixel electrode 210 and the opposite electrode 230 on the pixel electrode 210 in order to prevent generation of arc at the edge of the pixel electrode 210. The pixel defining layer 180 may include, for example, an organic insulating material such as polyimide, polyamide, an acrylic resin, benzocyclobutene, hexamethyldisiloxane (HMDSO), and a phenol resin, and may be obtained by a spin coating, etc.

The intermediate layer 220 may be on the pixel electrode 210 that is at least partially exposed via the pixel defining layer 180. The intermediate layer 220 may include an emission layer 220b, and a first functional layer 220a and a second functional layer 220c may be selectively provided under and on the emission layer 220b.

The first functional layer 220a may include a hole injection layer (HIL) and/or a hole transport layer (HTL), and the second functional layer 220c may include an electron transport layer (ETL) and/or an electron injection layer (EIL).

The emission layer 220b may include an organic material including a fluorescent or phosphor material emitting red, green, blue, or white light. The emission layer 220b may include low-molecular weight organic materials or polymer materials.

When the emission layer 220b includes a low-molecular weight organic material, the intermediate layer 220 may include an HIL, an HTL, the emission layer 220b, an ETL, and an EIL in a single or multiple-layered structure, and examples of the low-molecular weight material may include copper phthalocyanine (CuPc), N,N'-Di(naphthalene-1-yl)-N,N'-diphenyl-benzidine (NPB), and tris-8-hydroxyquinoline aluminum ($Alq_3$). The above layers may be manufactured by a vacuum deposition method.

When the emission layer 220b includes a polymer organic material, the intermediate layer 220 may include an HTL and the emission layer. Here, the HTL may include PEDOT, and the emission layer may include a poly-phenylenevinylene (PPV)-based or polyfluorene-based polymer material. The light-emitting layer may be arranged by using a screen printing method, an inkjet printing method, a laser induced thermal imaging (LITI) method, etc.

The first and second functional layers 220a and 220c that are under and on the emission layer 220b may be integrally provided throughout the entire display panel by using an open mask.

The opposite electrode 230 may be on the intermediate layer 220. The opposite electrode 230 is on the intermediate layer 220, and the opposite electrode 230 may entirely cover the intermediate layer 220. The opposite electrode 230 may be on the display area DA and may entirely cover the display area DA. That is, the opposite electrode 230 may be integrally provided throughout the entire display panel so as to cover the plurality of pixels P in the display area DA by using an open mask.

The opposite electrode 230 may include a conductive material having a low work function. For example, the opposite electrode 230 may include a (semi-) transparent layer including argentum (Ag), magnesium (Mg), aluminum (Al), platinum (Pt), palladium (Pd), aurum (Au), nickel (Ni), neodymium (Nd), iridium (Ir), chromium (Cr), lithium (Li), calcium (Ca), or an alloy thereof. Alternatively, the opposite electrode 230 may further include a layer including ITO, IZO, ZnO, or $In_2O_3$ on the (semi-) transparent layer including the above material.

The organic light-emitting diode OLED may be covered by the thin film encapsulation layer 300. The thin film encapsulation layer 300 may include at least one inorganic encapsulation layer and at least one organic encapsulation layer. In an embodiment, the thin film encapsulation layer 300 may include a first inorganic encapsulation layer 310 and a second inorganic encapsulation layer 330, and an organic encapsulation layer 320 between the first and second inorganic encapsulation layers 310 and 330.

The first and second inorganic encapsulation layers 310 and 330 may each include one or more inorganic insulating materials. The inorganic insulating material may include aluminum oxide, titanium oxide, tantalum oxide, hafnium oxide, zinc oxide, silicon oxide, silicon nitride, and/or silicon oxynitride. The organic encapsulation layer 320 may include a polymer-based material. The polymer-based material may include an acryl-based resin, an epoxy-based resin, polyimide, polyethylene, etc. For example, the organic encapsulation layer 320 may include an acryl-based resin, e.g., polymethylmethacrylate, polyacrylic acid, etc.

If the flexible substrate is isolated from the support substrate by using laser in a related manufacturing process, the flexible substrate including the polymer material may degrade.

Also, when the debonding layer is coated by alternately stacking the graphene oxide including positive charges and the graphene oxide including negative charges, a large equipment area and a longer processing time may be utilized, and accordingly, processing costs may be relatively higher.

To address the above issues, according to some example embodiments, the flexible substrate may be isolated from the support substrate by using the debonding layer, and the debonding layer may include a single material, that is, graphene oxide including negative charges, by arranging the metal oxide layer including positive charges between the support substrate and the debonding layer, and thus, an area occupied by equipment, a processing time, and processing costs may be relatively lower.

According to one or more example embodiments of the disclosure, the flexible substrate is isolated from the support substrate by using the debonding layer, wherein the debonding layer includes a single material, and thus, the area occupied by the equipment, the processing time, and processing costs may be relatively lower than alternative manufacturing methods. At the same time, the damage to the flexible substrate may be prevented or reduced, and thus, the display apparatus having relatively improved quality and the method of manufacturing the display apparatus may be implemented. However, the scope of embodiments according to the present disclosure is not limited to the above characteristics.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A method of manufacturing a display apparatus, the method comprising:
   preparing a support substrate;
   forming a metal oxide layer on a surface of the support substrate, the metal oxide layer comprising first charges;
   forming a debonding layer on a surface of the metal oxide layer, the debonding layer comprising second charges opposite to the first charges;
   forming a flexible substrate on a surface of the debonding layer;
   forming a display element and a thin film encapsulation layer on a surface of the flexible substrate, the display element comprising a thin film transistor and an organic light-emitting diode; and
   isolating the flexible substrate from the support substrate by removing the support substrate, the metal oxide layer, and a first portion of the debonding layer, with a second portion of the debonding layer remaining on the flexible substrate.

2. The method of claim 1, wherein, in isolating the flexible substrate from the support substrate, the flexible substrate is isolated from the support substrate based on the debonding layer.

3. The method of claim 2, wherein, in isolating the flexible substrate from the support substrate, the debonding layer at least partially remains on an opposite surface of the flexible substrate.

4. The method of claim 1, wherein the support substrate comprises the second charges.

5. A method of manufacturing a display apparatus, the method comprising:
   irradiating plasma onto the support substrate;
   forming a metal oxide layer on a surface of the support substrate, the metal oxide layer comprising first charges;
   forming a debonding layer on a surface of the metal oxide layer, the debonding layer comprising second charges opposite to the first charges;
   forming a flexible substrate on a surface of the debonding layer;
   forming a display element and a thin film encapsulation layer on a surface of the flexible substrate, the display element comprising a thin film transistor and an organic light-emitting diode; and
   isolating the flexible substrate from the support substrate; wherein the support substrate comprises the second charges.

6. The method of claim 1, wherein the metal oxide layer comprises at least one metal oxide material selected from the group consisting of silicon oxide ($SiO_2$), manganese oxide ($MnO_2$), zirconium oxide ($ZrO_2$), aluminum oxide ($Al_2O_3$), titanium oxide ($TiO_2$), indium tin oxide (ITO), chromium oxide ($CrO_3$), iron oxide ($Fe_3O_4$), lead oxide (PbO), nickel oxide (NiO), cadmium oxide (CdO), or magnesium oxide (MgO).

7. The method of claim 6, wherein, in the forming of the metal oxide layer, the metal oxide layer is formed on the support substrate to a thickness of 80 Angstroms (Å) to 120 Å.

8. The method of claim 1, wherein the debonding layer comprises graphene oxide.

9. The method of claim 8, wherein in the forming of the debonding layer, the debonding layer is formed on the metal oxide layer to a thickness of 30 Angstroms (Å) to 50 Å.

10. The method of claim 8, wherein, in the forming of the debonding layer, the debonding layer has an adhesive force of 2 gram-force/inch (gf/in) to 5 gf/in.

11. The method of claim 8, wherein, in the forming of the debonding layer, the debonding layer is formed by at least one of spray coating, spin coating, screen coating, offset printing, inkjet printing, pad printing, knife coating, kiss coating, gravure coating, brushing, ultrasonic micronized spray coating, or spray-mist spray coating.

12. The method of claim 1, wherein the first charges include positive charges and the second charges include negative charges.

13. A display apparatus comprising:
    a flexible substrate comprising a display area and a non-display area around the display area;
    a thin film transistor on a surface of the flexible substrate;
    an organic light-emitting diode on the thin film transistor; and
    a debonding layer on an opposite surface of the flexible substrate, the debonding layer comprising negative charges, with a first portion of the debonding layer removed from a second portion of the debonding layer that remains on the flexible substrate.

14. The display apparatus of claim 13, wherein the debonding layer comprises graphene oxide.

15. The display apparatus of claim 14, wherein the debonding layer is on the opposite surface of the flexible substrate to a thickness of 10 Angstroms (Å) to 30 Å.

16. The display apparatus of claim 14, wherein the debonding layer has an adhesive force of 2 gram-force (gf/in) to 5 gf/in.

17. The display apparatus of claim 13, wherein the organic light-emitting diode comprises:
    a pixel electrode;
    an intermediate layer on the pixel electrode, the intermediate layer comprising an emission layer; and
    an opposite electrode on the intermediate layer.

18. The display apparatus of claim 13, further comprising a storage capacitor comprising:
    a lower electrode on the surface of the flexible substrate; and
    an upper electrode overlapping the lower electrode.

19. The display apparatus of claim 13, further comprising a thin film encapsulation layer on the organic light-emitting diode, the thin film encapsulation layer comprising at least one inorganic encapsulation layer and at least one organic encapsulation layer.

20. The display apparatus of claim 13, wherein the flexible substrate comprises at least one material selected from the group consisting of polyethersulfone, polyacrylate, polyether imide, polyethylene naphthalate, polyethylene terephthalate, polyphenylene sulfide, polyarylate, polyimide, polycarbonate, or cellulose acetate propionate.

* * * * *